(12) United States Patent
Leem et al.

(10) Patent No.: US 7,687,908 B2
(45) Date of Patent: Mar. 30, 2010

(54) THIN FILM ELECTRODE FOR HIGH-QUALITY GAN OPTICAL DEVICES

(75) Inventors: Dong-seok Leem, Gwangju-si (KR); June-o Song, Gwangju-si (KR); Sang-ho Kim, Gwangju-si (KR); Tae-yeon Seong, Gwangju-si (KR)

(73) Assignees: Samsung Electronics Co., Ltd. (KR); Gwangju Institute of Science and Technology (KR)

( * ) Notice: Subject to any disclaimer, the term of this patent is extended or adjusted under 35 U.S.C. 154(b) by 391 days.

(21) Appl. No.: 10/886,686

(22) Filed: Jul. 9, 2004

(65) Prior Publication Data

US 2005/0006229 A1    Jan. 13, 2005

(30) Foreign Application Priority Data

Jul. 11, 2003    (KR) ............... 10-2003-0047273

(51) Int. Cl.
*H01L 23/48* (2006.01)
(52) U.S. Cl. ............ 257/750; 257/624; 257/766; 257/745; 257/615; 257/E29.145
(58) Field of Classification Search ........... 257/750, 257/766; 438/605
See application file for complete search history.

(56) References Cited

U.S. PATENT DOCUMENTS

| | | | |
|---|---|---|---|
| 6,319,808 B1 * | 11/2001 | Ho et al. ............ | 438/597 |
| 6,614,117 B1 * | 9/2003 | Tiku et al. ............ | 257/753 |
| 6,734,091 B2 * | 5/2004 | Oh et al. ............ | 438/605 |
| 6,969,874 B1 * | 11/2005 | Gee et al. ............ | 257/98 |
| 2003/0122144 A1 * | 7/2003 | Uemura et al. ............ | 257/99 |
| 2003/0164507 A1 * | 9/2003 | Edmond et al. ............ | 257/85 |
| 2004/0026702 A1 * | 2/2004 | Yamada et al. ............ | 257/80 |

FOREIGN PATENT DOCUMENTS

| | | |
|---|---|---|
| JP | 2001-35796 | 2/2001 |
| KR | 2002-0001665 | 1/2000 |
| KR | 010002265 A | 1/2001 |
| KR | 2002-0079513 | 10/2002 |

OTHER PUBLICATIONS

Korean Office Action dated Jul. 25, 2005 with English Translation.

* cited by examiner

*Primary Examiner*—Thanh Nguyen
(74) *Attorney, Agent, or Firm*—Cantor Colburn LLP

(57) ABSTRACT

A thin film electrode for ohmic contact of a p-type GaN semiconductor includes first and second electrode layers sequentially stacked on a p-type GaN layer. The first electrode layer may include an Ni-based alloy, a Cu-based alloy, a Co-based alloy, or a solid solution capable of forming a p-type thermo-electronic oxide or may include a Ni-oxide doped with at least one selected from Al, Ga, and In. The second electrode layer may include at least one selected from the group consisting of Au, Pd, Pt, Ru, Re, Sc, Mg, Zn, V, Hf, Ta, Rh, Ir, W, Ti, Ag, Cr, Mo, Nb, Ca, Na, Sb, Li, In, Sn, Al, Ni, Cu, and Co. Furthermore, a method of fabricating the thin film electrode is provided.

13 Claims, 2 Drawing Sheets

THIN FILM ELECTRODE FOR HIGH-QUALITY GAN OPTICAL DEVICES

BACKGROUND OF THE INVENTION

This application claims the priority of Korean Patent Application No. 2003-47273, filed on Jul. 11, 2003 with the Korean Intellectual Property Office, the disclosure of which is incorporated herein in its entirety by reference.

1. FIELD OF THE INVENTION

The present invention relates to a thin film electrode and a method of manufacturing the same capable of forming high-quality ohmic contact, which is one key technique in fabricating light emitting diodes (LEDs) and laser diodes (LDs) that emit short waves of blue, green and ultraviolet rays using a GaN semiconductor.

2. DESCRIPTION OF THE RELATED ART

When embodying optical devices such as LEDs and LDs using a GaN semiconductor, it is important to form a high-quality ohmic contact between a semiconductor and an electrode.

In the case of a conventional p-type GaN semiconductor, a Ni-based thin metal film structure, i.e., a thin metal film of Ni/Au, was widely used. Currently, various ohmic contact metal systems such as Ni/Pt/Au, Pt/Ni/Au, and Pd/Au are being developed.

However, two problems heretofore hinder a p-type GaN ohmic contact from ensuring high quality contact.

First, hydrogen H from NH4, which is an ambient gas used when growing a p-type GaN semiconductor, is combined with magnesium Mg, i.e., a p-type dopant. Thus, a Mg—H complex having an electrically insulating characteristic is formed, which results in a low effective carrier density and a high surface resistance value. Therefore, it is difficult to form a high-quality ohmic contact. Actually, the low hole injection makes the fabrication of high-quality optical devices difficult.

One example of increasing the doping density in a surface of the p-type GaN ohmic contact as above was published in Japanese Patent laid-open No. 2001-35796: Pd/Au. Here, a metal such as Ni or Pd that has a relatively large work function value and a high affinity for hydrogen and easily forms a Ga-related compound is placed in contact with GaN. Then, annealing is performed to activate the p-type dopant existing in a GaN crystal and obtain GaN with a highly effective carrier density by forming a plurality of Ga vacancies that serve as an acceptor. Thus, a Schottky barrier width (SBW) is reduced to result in a tunneling effect, thereby forming a high-quality ohmic contact.

As disclosed in Korean Patent No. 2001-0002265: Ni/Au, a thin metal film such as Ni and Co, which forms a transparent p-type conductive oxide by annealing in an oxygen-containing environment, is deposited on GaN. Then, a conductive oxide is formed by annealing to thus lower a Schottky barrier height (SBH) between the p-type GaN and the conductive oxide, thereby forming a high-quality ohmic contact.

A second problem is that there is no a high-quality ohmic contact system having high transmissivity in a short wavelength region of light.

A system with respect to Ni/Au currently available in an LED process obtains transmissivity of 80% or greater using Ni/Au film having thickness (less than 100 Å). An ohmic contact using such an extremely thin metal layer can obtain high transmissivity but is one reason for degrading efficiency of an optical device because of difficult current injection and propagation.

SUMMARY OF THE INVENTION

The present invention provides a thin film electrode capable of forming high-quality ohmic contact having a large work function value and high transmissivity in a short wavelength region of light and made of p-type thermo-electronic oxide while the effective carrier density around a surface of a GaN semiconductor is increased by destroying Mg—H combinations by making use of an excellent affinity for hydrogen of an alloy or solid solution that forms the p-type thermo-electronic oxide thin film.

The present invention provides a method of fabricating such a thin film electrode.

The present invention also provides an ohmic contact system having the above-described characteristics using an alloy or solid solution that forms a p-type thermo-electronic oxide thin film.

According to an aspect of the present invention, there is provided a thin film electrode for ohmic contact of a p-type GaN semiconductor, in which a first electrode layer is stacked on a p-type GaN layer and includes an Ni-based alloy or a solid solution (Ni—X) capable of forming a p-type thermo-electronic oxide thin film (PTE). Also, a second electrode layer is stacked on the first electrode layer and may include at least one selected from the group consisting of Au, Pd, Pt, Ru, Re, Sc, Mg, Zn, V, Hf, Ta, Rh, Ir, W, Ti, Ag, Cr, Mo, Nb, Ca, Na, Sb, Li, In, Sn, Al, Ni, Cu, and Co.

In the present invention, the Ni-based alloy or solid solution (Ni—X) that forms the p-type thermo-electronic oxide thin film uses Ni as a base element. Further, the X element is formed of one selected from the group consisting of Na, V, Ca, K, Cs, Ag, Sr, and Ba while excluding the elements of Group I, Group II, and La on the periodic table of the elements.

Here, the additive rate of the X element forming the Ni-based alloy or solid solution (Ni—X) that forms the p-type thermo-electronic oxide thin film is 1~99 atomic %.

According to another aspect of the present invention, there is provided a thin film electrode for ohmic contact of a p-type GaN semiconductor, in which a first electrode layer is stacked on a p-type GaN layer and includes a Cu-based alloy or a solid solution capable of forming a p-type thermo-electronic oxide thin film. A second electrode layer is stacked on the first electrode layer and may include one selected from the group consisting of Au, Pd, Pt, Ru, Re, Sc, Mg, Zn, V, Hf, Ta, Rh, Ir, W, Ti, Ag, Cr, Mo, Nb, Ca, Na, Sb, Li, In, Sn, Al, Ni, Cu, and Co.

Here, the Cu-based alloy or solid solution (Cu—X) that forms the p-type thermo-electronic oxide thin film uses Cu as a base element. Then, the X element may include at least one selected from the group consisting of Group I elements, Group II elements, Group III elements on the periodic table of the elements, as well as Zn, Pd, Ag, Rh, Re, Pt, Co, Ru, Ir, Zr, V, and Ti.

The additive rate of the X element forming the Cu-based alloy or solid solution (Cu—X) is 1-99 atomic %.

According to still another aspect of the present invention, there is provided a thin film electrode for ohmic contact of a p-type GaN semiconductor, in which a first electrode layer is stacked on a p-type GaN layer and includes a Co-based alloy or a solid solution capable of forming a p-type thermo-electronic oxide thin film. Also, a second electrode layer is stacked on the first electrode layer and may include one selected from the group consisting of Au, Pd, Pt, Ru, Re, Sc, Mg, Zn, V, Hf, Ta, Rh, Ir, W, Ti, Ag, Cr, Mo, Nb, Ca, Na, Sb, Li, In, Sn, Al, Ni, Cu, and Co.

At this time, the Co-based alloy or solid solution (Co—X) that forms the p-type thermo-electronic oxide thin film uses Co as a base element. Then, the X element may include one selected from the group consisting of Group I elements, Group II elements, Group III elements on the periodic table of the elements, as well as Zn, Pd, Ag, Rh, Re, Pt, Co, Ru, Ir, Zr, V, and Ti.

Here, the additive rate of the X element forming the Co-based alloy or solid solution (Co—X) is 1~99 atomic %.

According to yet another aspect of the present invention, there is provided a thin film electrode for ohmic contact of a p-type GaN semiconductor, in which a first electrode layer is stacked on a p-type GaN layer and includes a nickel oxide doped with an X element that forms the p-type thermo-electronic oxide thin film. Also, a second electrode layer is stacked on the first electrode layer and may include at least one selected from the group consisting of Au, Pd, Pt, Ru, Re, Sc, Mg, Zn, V, Hf, Ta, Rh, Ir, W, Ti, Ag, Cr, Mo, Nb, Ca, Na, Sb, Li, In, Sn, Al, Ni, Cu, and Co.

At this time, the doped nickel oxide that forms the p-type thermo-electronic oxide thin film may be doped with at least one selected from the group consisting of Al, Ga, and In within a range of 0.1~5.1% by atomic weight.

The thicknesses of the first and second electrodes may be 1~10,000 Å and 1~50,000 Å, respectively.

The Group I elements may include one selected from the group consisting of Li, Na, K, Cs, and Rb; the Group II elements may include one selected from the group consisting of Be, Mg, Ca, Sr, and Ba; and the Group III elements may include one selected from the La-based group including Sc and La.

Furthermore, a pure metal layer is formed between the p-type GaN layer and the first electrode layer and may include at least one selected from the group consisting of Ni, Au, Pd, Pt, Rh, Re, Ru, and Ir.

A thickness of the pure metal electrode layer is 1~1,000 Å. Moreover, the p-type GaN layer is formed of $Al_xIn_yGa_zN$ (where $0<x, y, z<1$ and $x+y+z=1$).

According to another aspect of the present invention, there is provided a method of fabricating a thin film electrode for a light emitting device on a p-type GaN layer. Here, the method comprises steps of removing impurities from the surface of the p-type GaN layer, depositing a solid solution at a pressure of $2\times10^{-6}$ to $5\times10^{-8}$ Torr on the p-type GaN layer from the surface of which the impurities are removed, and annealing the resultant structure in which the solid solution is formed on the p-type GaN layer at a temperature of 250~800° C. for 30 seconds to 1 hour in an air, oxygen, or nitrogen environment.

According to another aspect of the present invention, there is provided a method of fabricating a thin film electrode for a light emitting device on a p-type GaN layer. Here, the method may comprise steps of removing impurities such as carbon and oxygen layers from the surface of the p-type GaN layer, depositing one selected from the group consisting of $PdCoO_2$, $Na_xCoO_2$, $NaCo_2O_4$, and $La_2CuO_4$ on the p-type GaN layer at a pressure of $2\times10^{-6}$ to $5\times10^{-8}$ Torr, and annealing the resultant structure at a temperature of 250~800° C. for 30 seconds to 1 hour in an air, oxygen, or nitrogen environment after the deposition.

According to still another aspect of the present invention, there is provided a method of fabricating a thin film electrode for a light emitting device on a p-type GaN layer. Here, the method comprises steps of, before depositing an alloy or a solid solution, removing impurities such as carbon and oxygen layers from the surface of the p-type GaN layer, depositing the alloy or the solid solution using one of an e-beam evaporator, a sputter, and a pulse laser depositor at a pressure of $2\times10^{-6}$ to $5\times10^{-8}$ Torr, and, after the deposition, annealing the resultant structure, in which the alloy or the solid solution is deposited, at a temperature of 250~800° C. for 30 seconds to 1 hour in an air, oxygen, or nitrogen environment.

According to the present invention, after an alloy or a solid solution that forms a p-type thermo-electronic oxide thin film is deposited on a p-type GaN layer, annealing is carried out, thereby adjusting the energy band gap between the p-type GaN and the p-type thermo-electronic oxide and increasing the effective carrier density in a surface thereof. As a result, the Schottkey barrier height and width between the p-type GaN and the p-type thermo-electronic oxide are reduced. Therefore, there is provided a high-quality ohmic contact system having high transmissivity in a short wavelength region of light while providing excellent current-voltage characteristics and low specific contact resistance.

According to the present invention, using the excellent electricity conductive and thermostable properties, the p-type thermo-electronic oxides can replace typical metal electrodes. Also, Ni, Co, and Cu, which are thermodynamically favorable for forming a GaN-related compound, are used as major base metals of the p-type thermo-electronic oxides to allow for the production of a large quantity of Ga vacancies in a surface of the p-type GaN.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings.

Figure 1:
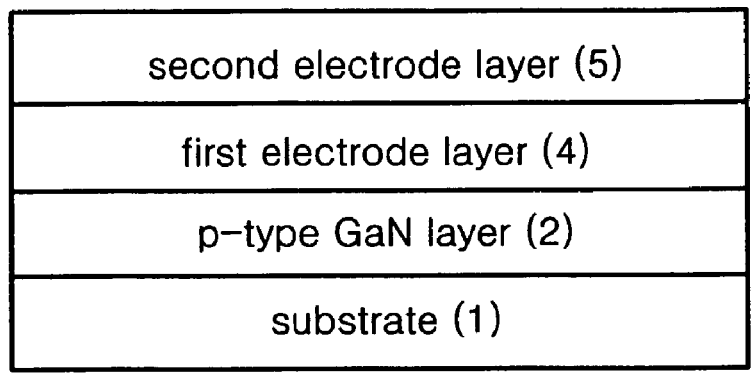
FIG. 1 is a sectional view showing a thin film electrode according to a first aspect of one embodiment of the present invention.

FIG. 1 shows a stacked structure that includes a thin film electrode according to a first embodiment of the present invention.

Referring to FIG. 1, a p-type GaN semiconductor is formed by sequentially stacking a p-type GaN layer 2, a first electrode layer 4, and a second electrode layer 5 on a substrate layer 1.

The first electrode layer 4 is for forming an ohmic contact of the p-type GaN semiconductor and includes an alloy or a solid solution for forming a p-type thermo-electronic oxide thin film. Preferably, the alloy or the solid solution is formed of a material that easily destroys the Mg—H combination within the p-type GaN semiconductor, forms a compound with Ga, and changes to a transparent p-type thermo-electronic conductive oxide with a large work function value during annealing, thereby providing high transmissivity even with a thickness of 100 Å or greater.

The alloy or solid solution in contact with the p-type GaN layer 2 easily destroys the Mg—H combination within the GaN semidonconductor during annealing at a low temperature (lower than 600° C.) and forms a compound with Ga, thereby decreasing the Schottky barrier width which is an energy barrier at an interface. Furthermore, the alloy or solid solution changes into a transparent p-type thermo-electronic conductive oxide with a large word function value to control the energy band gap at the interface, thereby decreasing the Schottky barrier height.

The high effective carrier density (greater than $10^{18}$ number of carrier/$cm^3$) in the surface of the GaN layer 2 caused by the reactivated Mg, which is a dopant, and the Ga vacancies in the surface of the GaN layer 2 decreases the Schottky barrier width existing at the interface between electrodes in contact with the p-type GaN layer 2. Therefore, high conductivity of the carriers can be incited by a tunneling effect in the quantum concept of holes which are plural carriers.

While annealing is performed at a temperature of 600° C. and below, the electrodes made of the alloy or solid solution changes to electrodes made of a transparent p-type thermo-electronic conductive oxide and having a large work function. Thus, the Schottky barrier height between the p-type GaN and the p-type thermo-electronic oxide is lowered, so that carrier flow is facilitated to allow for the formation of high-quality ohmic contact.

The second electrode layer 5 as the uppermost layer of the thin film electrode is preferably formed of a material that has the capability of preventing surface degradation that occurs during a high temperature (300~700° C.) process, which is applied to a device fabricating process of LEDs and LDs, is stable to oxidation, and has a good wire bonding and excellent transparency properties. The component of the uppermost layer is not specifically defined.

Representative examples of the uppermost layer that satisfy the above requirements include Au, Pd, Pt, Ru, Re, Sc, Mg, Zn, V, Hf, Ta, Rh, Ir, W, Ti, Ag, Cr, Mo, Nb, Ca, Na, Sb, Li, In, Sn, Al, Ni, Cu, and Co.

Figure 2:
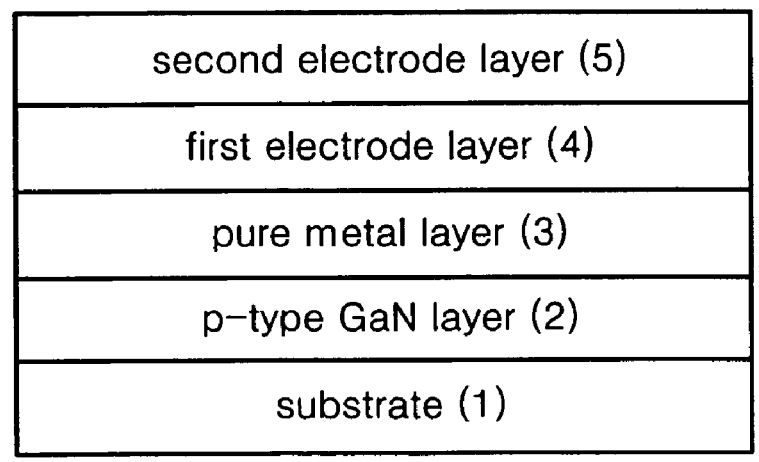
FIG. 2 is a sectional view showing a thin film electrode according to a second aspect of one embodiment of the present invention.

FIG. 2 shows a stacked structure including the thin film electrode according to a second embodiment of the present invention.

Referring to FIG. 2, a p-type GaN semiconductor is formed by sequentially stacking a p-type GaN layer 2, a pure metal layer 3, a first electrode layer 4, and a second electrode layer 5 on a substrate layer 1.

The first electrode layer 4 including an alloy or solid solution capable of forming a p-type thermo-electronic oxide and the second electrode 5 as the uppermost layer are identical to those described with reference to the thin film electrode according to the first embodiment of the present invention.

The pure metal electrode layer 3 is preferably formed of a metal layer capable of primarily forming a compound with Ga during annealing at a low temperature after being deposited on the p-type GaN layer 2. The pure metal electrode layer 3 is preferably formed of a metal such as Ni, Au, Pt, Pd, Ir, Rh, Re and Ru, which has an excellent capability of forming a Ga-related compound and has a larger work function value than other metals.

Figure 3:
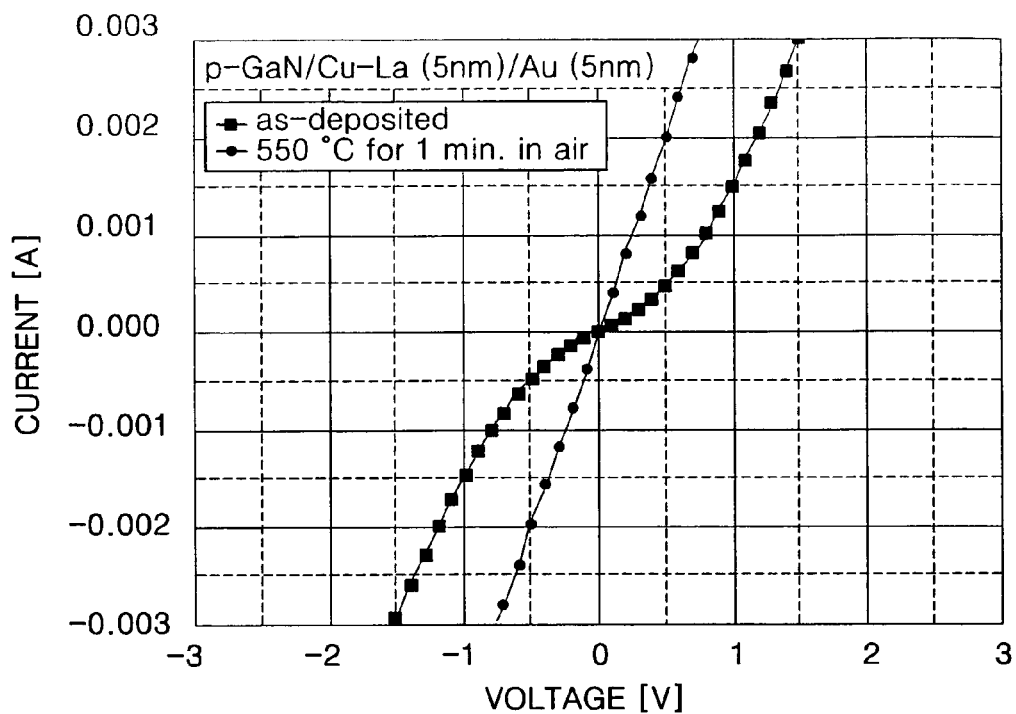
FIG. 3 shows a graph plotting current-voltage characteristics before and after annealing, after a Cu—La alloy or a solid solution/Au combination is deposited on an upper portion of a p-type GaN semiconductor with a carrier density of $5\times10^{17}$ number of carrier/cm$^3$ in the thin film electrode according to one embodiment of the present invention.

FIG. 3 shows a graph plotting current-voltage characteristics before and after annealing, after a Cu—La alloy or a solid solution/Au combination is deposited on an upper portion of the p-type GaN semiconductor with a carrier density of $5 \times 10^{17}$ number of carrier/$cm^3$ in the thin film electrode according to one embodiment of the present invention.

Referring to FIG. 3, a specific contact resistance at a level of about $10^{-6}$ $\Omega$-$cm^2$ is obtained when the current-voltage characteristic is measured after annealing for 1 minute at a temperature of 550° C. in an air environment.

The curve obtained from the air environment clearly shows a linear relationship indicating an excellent ohmic contact characteristic, but the curve obtained from a nitrogen environment shows a non-linear relationship indicating a rectifying contact characteristic.

Figure 4:
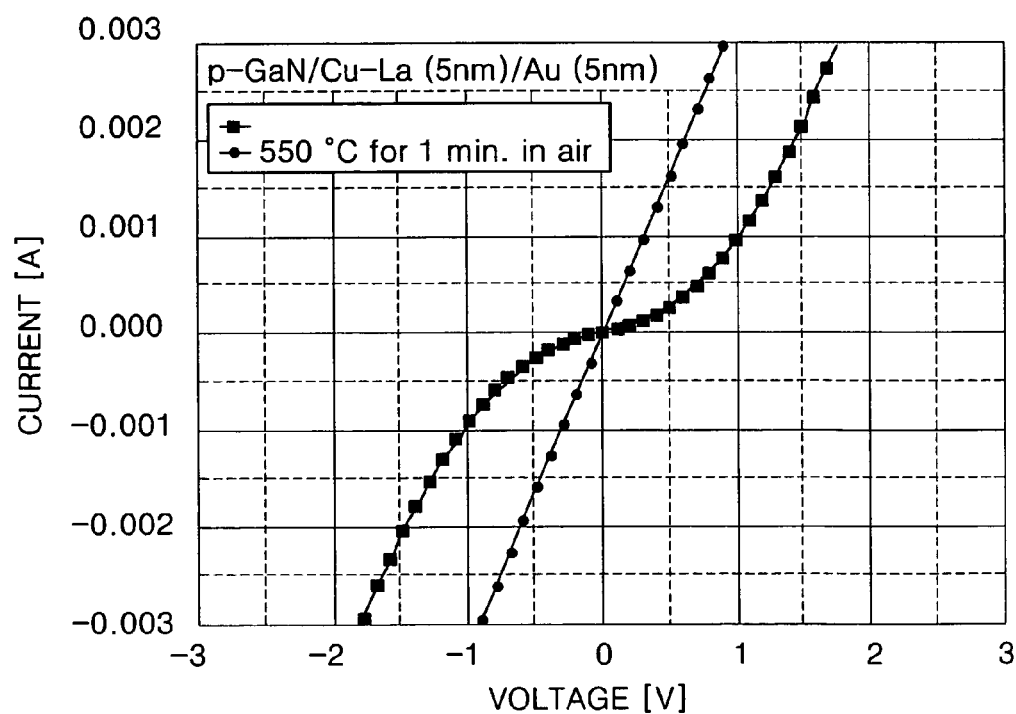
FIG. 4 shows a graph plotting current-voltage characteristics before and after annealing, after a pure metal that forms a Ga-related compound, a Pd/Cu—La alloy, or a solid solution/Au combination is deposited on an upper portion of a p-type GaN semiconductor with a carrier density of $5\times10^{17}$ number of carrier/cm$^3$ in the thin film electrode according to one embodiment of the present invention.

FIG. 4 shows a graph plotting the current-voltage characteristics before and after annealing, after a pure metal that forms a Ga-related compound, a Pd/Cu—La alloy, or a solid solution/Au combination is deposited on an upper portion of the p-type GaN layer with a carrier density of $5 \times 10^{17}$ number of carrier/$cm^3$ in the thin film electrode according to one embodiment of the present invention.

Referring to FIG. 4, an ohmic contact resistance value of $\sim 10^{-6}$ $\Omega$-$cm^2$ is obtained when the current-voltage characteristic is measured after annealing for 1 minute at a temperature of 550° C. Here, a clearly linear curve showing the ohmic contact characteristic can be obtained.

The aforementioned high-quality ohmic contact technique using the p-type thermo-electronic oxide can be used for forming ohmic contact in Flip-chip LEDs designed for increasing luminous efficiency in addition to the ohmic contact of general top emitting LEDs.

Experiments conducted by this inventor relating to the present invention will be described below. The following experiments should be considered in a descriptive sense only and not for any limiting purposes.

Experiment 1

A surface of the p-type GaN semiconductor is cleaned with trichloroethylene, acetone, methanol, and pure water within an ultrasonic wave cleaner at a temperature of 60° C. for five minutes. Then, hard baking is performed at 100° C. for 10 minutes so as to remove any water remaining in the specimen. Thereafter, a photoresist is spin-coated at 4,000 rpm, which is then soft baked at a temperature of 88° C. for 10 minutes. After aligning the mask and specimen so as to develop a mask pattern, they are exposed to ultraviolet rays at an intensity of 22.8 mW for 10 seconds. The specimen is sintered in a solution obtained by mixing a development solution and distilled water in a ratio of 1:4, thereby being developed for 15 seconds or so.

Then, the resultant structure is sintered for 5 minutes in order to eliminate a contaminated layer on the developed specimen using a buffered oxide etch (BOE) solution. Using an electron beam depositor, a Cu—La solid solution and Au are respectively deposited at 50° C. After being subjected to a lift-off process with acetone, the specimen is put in a quick heater and is annealed at 550° C. for 1 minute in an air environment, thereby fabricating a metal thin film for forming the ohmic contact.

Experiment 2

The process until depositing an electrode material using an electron beam depositor is identical with that of the foregoing Experiment 1. Here, the electron beam depositor is used for stacking a Pd/Cu—La solid solution/Au combination to a thickness of 50 Å, respectively. Lift-off is performed using acetone. The specimen is put in a quick heater at 550° C. for 1 minute in an air environment, thereby fabricating a metal thin film of forming the ohmic contact.

According to the present invention, the transparent p-type thermo-electronic conductive oxide thin films for LEDs and LDs of high efficiency using the ohmic contact formation may effect excellent electrical and optical characteristics such as low specific contact resistance, excellent current-voltage characteristics, a good surface condition, and high transparency. Therefore, the electric and optical efficiencies of future LEDs and LDs are increased so that the transparent p-type thermo-electronic conductive oxide thin film may be used in developing high-quality GaN LEDs and LDs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film electrode for ohmic contact of a p-type GaN semiconductor, comprising:
   a first electrode layer stacked on a p-type GaN layer, the first electrode layer including one selected from the group consisting of an Ni-based alloy or solid solution (Ni—X), a Co-based alloy or solid solution (Co—X), and a nickel oxide doped with at least one selected from the group consisting of Al, Ga, and In, wherein the first electrode layer is a p-type thermo-electronic oxide; and
   a second electrode layer stacked on the first electrode layer, the second electrode layer including at least one selected from the group consisting of Au, Pd, Pt, Ru, Re, Sc, Mg, Zn, V, Hf, Ta, Rh, Ir, W, Ti, Ag, Cr, Mo, Nb, Ca, Na, Sb, Li, In, Sn, Al, Ni, Cu, and Co,
   wherein the Ni-based alloy or solid solution (Ni—X) uses Ni as a base element and the X element comprises one selected from the group consisting of Na, Ca, K, Cs, Sr, and Ba.

2. The thin film electrode for ohmic contact of a p-type GaN semiconductor of claim 1, wherein the additive rate of the X element is 1~99 atomic %.

3. The thin film electrode for ohmic contact of a p-type GaN semiconductor of claim 1, wherein thicknesses of the first and second electrode layers are 1~10,000 Å and 1~50,000 Å, respectively.

4. The thin film electrode for ohmic contact of a p-type GaN semiconductor of claim 1, further comprising a pure metal layer formed between the p-type GaN layer and the first electrode layer, the pure metal layer including at least one selected from the group consisting of Ni, Au, Pd, Pt, Rh, Re, Ru, and Ir, and being adapted to transmit light.

5. The thin film electrode for ohmic contact of a p-type GaN semiconductor of claim 4, wherein the thickness of the pure metal layer is 1~1,000 Å.

6. The thin film electrode for ohmic contact of a p-type GaN semiconductor of claim 1, wherein the p-type GaN layer is formed of $Al_xIn_yGa_zN$ (where 0<x, y, z<1 and x+y+z=1).

7. The thin film electrode for ohmic contact of a p-type GaN semiconductor of claim 4, wherein the p-type GaN layer is formed of $Al_xIn_yGa_zN$ (where 0<x, y, z<1 and x+y+z=1).

8. The thin film electrode for ohmic contact of a p-type GaN semiconductor of claim 1, wherein the second electrode layer includes at least one selected from the group consisting of Pd, Ru, Re, Sc, Mg, Zn, V, Hf, Ta, Rh, Ir, W, Ti, Cr, Mo, Nb, Ca, Na, Sb, Li, In, Sn, Al, Ni, Cu, and Co.

9. A thin film electrode for ohmic contact of a p-type GaN semiconductor, comprising:
   a first electrode layer stacked on a p-type GaN layer, the first electrode layer including one selected from the group consisting of an Ni-based alloy or solid solution (Ni—X), a Cu-based alloy or solid solution (Cu—X), a Co-based alloy or solid solution (Co—X), and a nickel oxide doped with at least one selected from the group consisting of Al, Ga, and In, wherein the first electrode layer is a p-type thermo-electronic oxide;
   a pure metal layer formed between the p-type GaN layer and the first electrode layer, the pure metal layer including at least one selected from the group consisting of Ni, Au, Pd, Pt, Rh, Re, Ru, and Ir, and being adapted to transmit light; and
   a second electrode layer stacked on the first electrode layer, the second electrode layer including at least one selected from the group consisting of Au, Pd, Pt, Ru, Re, Sc, Mg, Zn, V, Hf, Ta, Rh, Ir, W, Ti, Ag, Cr, Mo, Nb, Ca, Na, Sb, Li, In, Sn, Al, Ni, Cu, and Co,
   wherein the Ni-based alloy or solid solution (Ni—X) uses Ni as a base element and the X element comprises one selected from the group consisting of Na, Ca, K, and the X element comprises one selected from the group consisting of Na, Ca, K, Cs, Sr, and Ba,
   wherein the Cu-based alloy or solid solution (Cu—X) uses Cu as a base element and the X element comprises at least one selected from the group consisting of Group I elements, Group II elements, Group III elements on the periodic table of the elements, as well as Zn, Pd, Rh, Re, Pt, Ru, Ir, Zr, and Ti.

10. The thin film electrode for ohmic contact of a p-type GaN semiconductor of claim 9, wherein the additive rate of the X element is 1~99 atomic %.

11. The thin film electrode for ohmic contact of a p-type GaN semiconductor of claim 9, wherein thicknesses of the first and second electrode layers are 1~10,000 Å and 1~50,000 Å, respectively.

12. The thin film electrode for ohmic contact of a p-type GaN semiconductor of claim 9, wherein the thickness of the pure metal layer is 1~1,000 Å.

13. The thin film electrode for ohmic contact of a p-type GaN semiconductor of claim 9, wherein the p-type GaN layer is formed of $Al_xIn_yGa_zN$ (where 0<x, y, z<1 and x+y+z=1).

* * * * *